US008334587B2

(12) United States Patent  
Inoue et al.

(10) Patent No.: US 8,334,587 B2
(45) Date of Patent: Dec. 18, 2012

(54) SEMICONDUCTOR LIGHT EMITTING DEVICE WITH FIRST AND SECOND LEADS

(75) Inventors: Kazuhiro Inoue, Fukuoka-ken (JP); Haruhiko Okazaki, Fukuoka-ken (JP); Hiroyuki Nakashima, Fukuoka-ken (JP)

(73) Assignee: Kabushiki Kaisha Toshiba, Minato-ku, Tokyo (JP)

( * ) Notice: Subject to any disclaimer, the term of this patent is extended or adjusted under 35 U.S.C. 154(b) by 635 days.

(21) Appl. No.: 11/697,448

(22) Filed: Apr. 6, 2007

(65) Prior Publication Data

US 2007/0241342 A1 Oct. 18, 2007

(30) Foreign Application Priority Data

Apr. 7, 2006 (JP) ................. 2006-106620

(51) Int. Cl.
*H01L 23/48* (2006.01)

(52) U.S. Cl. ........ 257/692; 257/784; 257/684; 257/690; 257/E23.01

(58) Field of Classification Search ............... 257/130, 257/432, 433, 434, 437
See application file for complete search history.

(56) References Cited

U.S. PATENT DOCUMENTS

| 6,459,130 B1 * | 10/2002 | Arndt et al. ............. 257/432 |
| 6,624,491 B2 * | 9/2003 | Waitl et al. ............. 257/434 |
| 2002/0004251 A1 * | 1/2002 | Roberts et al. ............. 438/26 |
| 2002/0050779 A1 * | 5/2002 | Yu ............. 313/483 |
| 2004/0079957 A1 * | 4/2004 | Andrews et al. ............. 257/100 |
| 2005/0162069 A1 | 7/2005 | Ota et al. |
| 2006/0054901 A1 | 3/2006 | Shoji et al. |

FOREIGN PATENT DOCUMENTS

| JP | 2001-185763 A | 7/2001 |
| JP | 2002-198570 A | 7/2002 |
| JP | 2002-314148 A | 10/2002 |
| JP | 2002-324917 A | 11/2002 |

\* cited by examiner

*Primary Examiner* — Wael Fahmy
*Assistant Examiner* — Eva Yan Montalvo
(74) *Attorney, Agent, or Firm* — Banner & Witcoff, Ltd.

(57) ABSTRACT

In at least one aspect, a semiconductor light emitting device may include a first lead, a second lead provided being apart from the first lead, a semiconductor light emitting element provided on the first lead, a wiring electrically connecting the semiconductor light emitting element and the second lead, a first resin being optically transparent to light from the semiconductor light emitting element, the first resin covering the semiconductor light emitting element, and a second resin provided on the first resin, the first lead and the second lead, and being optically transparent to light from the semiconductor light emitting element, wherein a part of the first lead which is covered with the second resin is symmetric with respect to a vertical line passing through the semiconductor light emitting element in a cross-sectional view cut along a plane, the plane passing the semiconductor light emitting element and being parallel with a direction to which the first lead is extended.

22 Claims, 23 Drawing Sheets

SEMICONDUCTOR LIGHT EMITTING DEVICE WITH FIRST AND SECOND LEADS

CROSS REFERENCE TO RELATED APPLICATION

This application is based upon and claims the benefit of priority from Japanese Patent Application No. 2006-106620, filed on Apr. 7, 2006, the entire contents of which are incorporated herein by reference.

BACKGROUND

Known semiconductor light emitting devices include a semiconductor light emitting element (LED) molded by a resin. In such a conventional semiconductor light emitting device, the components are subjected to expansion and contraction of the resin from changing temperature. Peeling, breaking, and cracking may occur in the conventional semiconductor device.

In one example, a semiconductor light emitting chip and/or electrical connecting means near the semiconductor light emitting chip are/is covered with a transparent elastic resin.

SUMMARY

Aspects of the invention relate to an improved semiconductor light emitting device.

BRIEF DESCRIPTIONS OF THE DRAWINGS

A more complete appreciation of the invention and many of the attendant advantages thereof will be readily obtained as the same becomes better understood by reference to the following detailed description when considered in connection with the accompanying drawings.

FIG. 1A is a plane view of a semiconductor light emitting device in accordance with a first embodiment. FIG. 1B is a cross-sectional view of the semiconductor light emitting device in accordance with the first embodiment. FIG. 1C is an enlarged cross-sectional view around a semiconductor light emitting element provided in the semiconductor light emitting device. FIG. 1D is a perspective view of the semiconductor light emitting device in accordance with the first embodiment.

FIG. 2A is a plane view of a semiconductor light emitting device in accordance with a comparative example. FIG. 2B is a cross-sectional view of the semiconductor light emitting device in accordance with a comparative example. FIG. 2C is a perspective view of the semiconductor light emitting device in accordance with a comparative example.

DETAILED DESCRIPTION

Figure 1A:
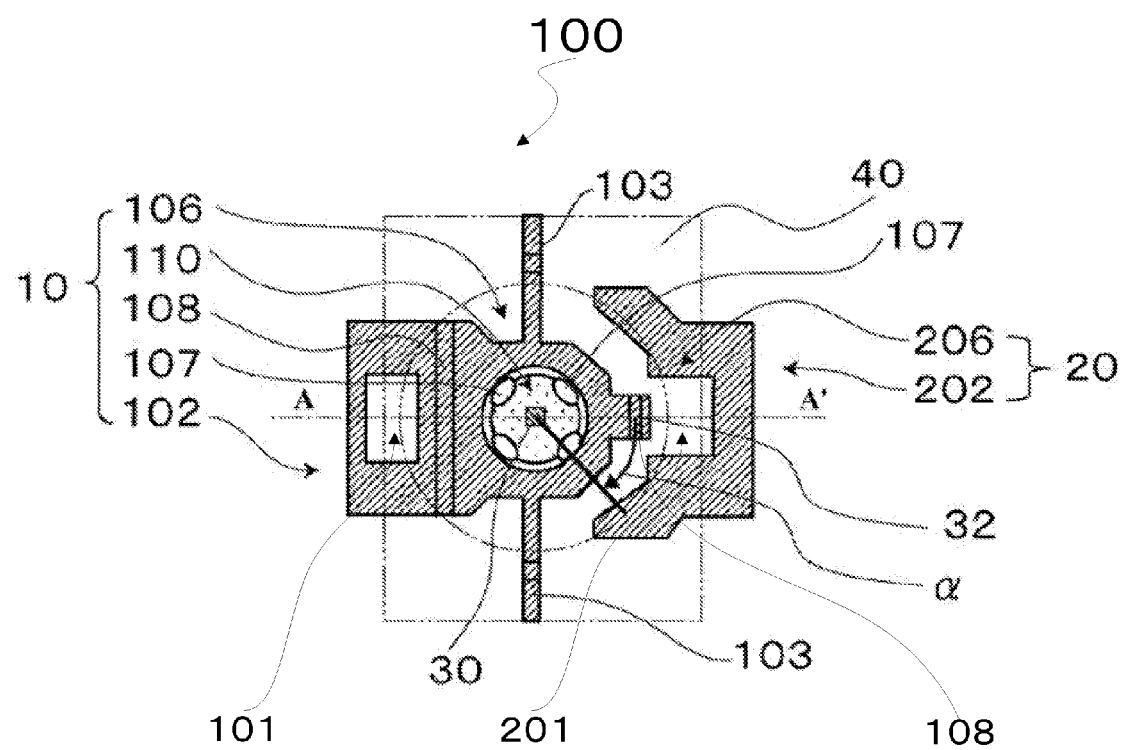

Various connections between elements are hereinafter described. It is noted that these connections are illustrated in general and, unless specified otherwise, may be direct or indirect and that this specification is not intended to be limiting in this respect.

Embodiments of the present invention will be explained with reference to the drawings as next described, wherein like reference numerals designate identical or corresponding parts throughout the several views.

General Overview

In one aspect of the present invention, a semiconductor light emitting device may include a first lead, a second lead provided being apart from the first lead, a semiconductor light emitting element provided on the first lead, a wiring electrically connecting the semiconductor light emitting element and the second lead, a first resin being optically transparent to light from the semiconductor light emitting element, the first resin covering the semiconductor light emitting element, and a second resin provided on the first resin, the first lead and the second lead, and being optically transparent to light from the semiconductor light emitting element, wherein a part of the first lead which is covered with the second resin is symmetric with respect to a vertical line passing through the semiconductor light emitting element in a cross-sectional view cut along a plane, the plane passing the semiconductor light emitting element and being parallel with a direction to which the first lead is extended.

In another aspect of the invention, a semiconductor light emitting device may include a first lead, a second lead provided being apart from the first lead, a semiconductor light emitting element provided on the first lead, a wiring electrically connecting the semiconductor light emitting element and the second lead, a first resin being optically transparent to light from the semiconductor light emitting element, the first resin covering the semiconductor light emitting element, a second resin provided on the first resin and being optically transparent to light from the semiconductor light emitting element, wherein the first lead has a plurality of bent portions, and the bent portions are apart a substantially same distance from the semiconductor light emitting element.

In yet another aspect of the invention, a semiconductor light emitting device may include a semiconductor light emitting device may include a first lead, a second lead provided being apart from the first lead, a semiconductor light emitting element provided on the first lead, a wiring electrically connecting the semiconductor light emitting element and the second lead, a first resin being optically transparent to light from the semiconductor light emitting element, the first resin covering the semiconductor light emitting element, a second resin provided on the first resin, the first lead and the second lead, and being optically transparent to light from the semiconductor light emitting element, wherein the first lead has a plurality of openings and the second lead has a opening, the openings are apart a substantially same distance from the semiconductor light emitting element and have a substantially same width in a cross-sectional view cut along a plane, the plane passing the semiconductor light emitting element and being parallel with a direction which the first lead is extended to, and the opening of the second lead and one of the openings of the first lead are apart a substantially same distance from the semiconductor light emitting element and have a substantially same width in a cross-sectional view cut along the plane.

FIRST EMBODIMENT

A first embodiment of the present invention will be explained hereinafter with reference to FIGS. 1A-4B. FIGS. 1A-1D show a semiconductor light emitting device 100 in accordance with the first embodiment.

Figure 1B:
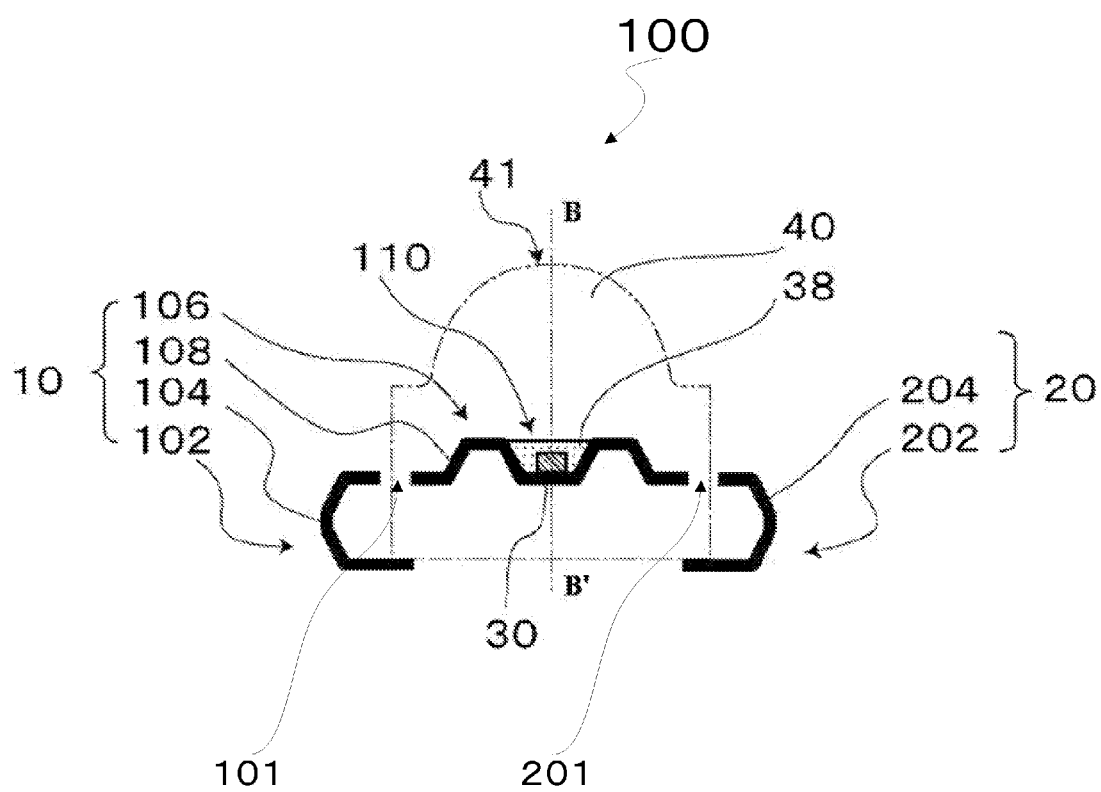

A first lead 10 and a second lead 20 are provided in the semiconductor light emitting device 100. The first lead 10 has an inner lead 106 and an outer lead 102. In the inner lead 106, a cup shape recess portion 110 is provided. On the bottom of the recess portion 110, a semiconductor light emitting element 30 is provided. The outer lead 102 has a J-bend portion 104. An anchor hole 107 is provided in the recess portion 110. In FIGS. 1A and 1B, four anchor holes 107 are provided. The diameter of the anchor hole 107 may be about 0.2 mm or larger or smaller as desired. The anchor holes 107 may be symmetric or asymmetric with respect to the semiconductor light emitting element 30 in the plane view as shown in FIG. 1A.

In this embodiment, the inner lead 106 may include a portion of the lead provided in the second resin 40, and the outer lead may include a portion of the lead exposed to outside from the second resin 40.

The semiconductor light emitting element 30 is configured to emit light upward as shown in FIG. 1B. The optical axis of the semiconductor light emitting element 30 may be identical to the B-B' line in FIG. 1B. The B-B' line is a vertical line passing the semiconductor light emitting element 30. A bent portion 108 is provided in the inner lead 106. One bent portion 108 is provided on the left from the semiconductor light emitting element 30 as in FIG. 1A, and another bent portion 108 is provided on the right from the semiconductor light emitting element 30 as in FIG. 1A. The two bent portions 108 are provided being symmetric with the vertical line B-B'. In other words, two bent portions 108 are separated substantially same distance from the semiconductor light emitting element 30. So heat stress between the second resin 40 and the semiconductor light emitting element 30 and the wiring 32 may be provided on or near a center line of the semiconductor light emitting device 100. The center line of the semiconductor light emitting device 100 may be identical to the B-B' line. Thus, the heat stress to the semiconductor light emitting element 30 and the wiring 32 may be reduced.

As shown in FIGS. 1A and 1B, a width of the opening 101 and the gap 201 between the first lead 10 and second lead 20 may be symmetric with the vertical line B-B'.

Furthermore, a part of the opening 101, which is embedded in the second resin 40, and a part of the gap 201, which is embedded in the second resin 40, may be symmetric with vertical line B-B'. So the heat stress to the semiconductor light emitting element 30 and the wiring 32 may be reduced.

In this embodiment, as shown in FIG. 1B, the semiconductor light emitting element 30 is provided at the center of the semiconductor light emitting device 100 in the plane view.

A support pin 103 is provided in the second resin 40. The support pins 103 extend from the inner lead 106 in a direction perpendicular to the A-A' line in FIG. 1A. Bent portions are provided in the support pins 103, respectively. The bent portions of the support pins 103 are provided being symmetric with the vertical line passing the semiconductor light emitting element 30. In other words, two bent portions of the support pins 103 are apart substantially same distance from the semiconductor light emitting element 30. So the heat stress to the semiconductor light emitting element 30 and the wiring 32 may be reduced more than in a case the bent portions are not provided.

In this embodiment, "symmetric" or "symmetry" is not necessarily exactly symmetric or having symmetry in various aspects of mathematics. The substantially symmetric or having substantial symmetry may be defined as a plurality of members being symmetric or having symmetry based on technical documents or design drawings.

In this embodiment, the same is not exact same in aspect of mathematics. Substantially same may be defined as based on technical documents or design drawings.

The second lead 20 has an inner lead 206 and an outer lead 202. The inner lead 206 and the semiconductor light emitting element 30 are electrically connected via the wiring 32, which is made of Au or the like. The outer lead 202 has a J bend portion 204. It may be easier by the J bend portions 104 and 204 to attach on a circuit board or mounting board.

Figure 1C:
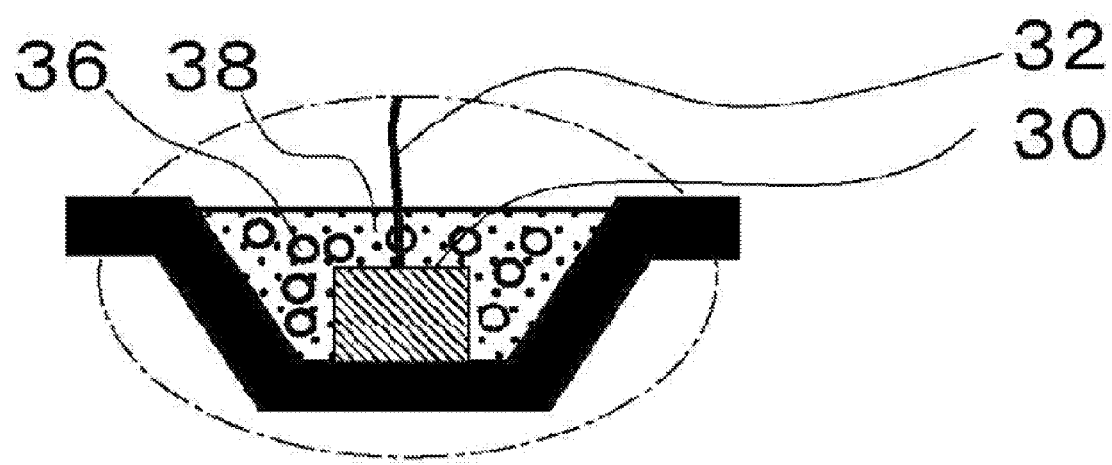
Figure 1D:
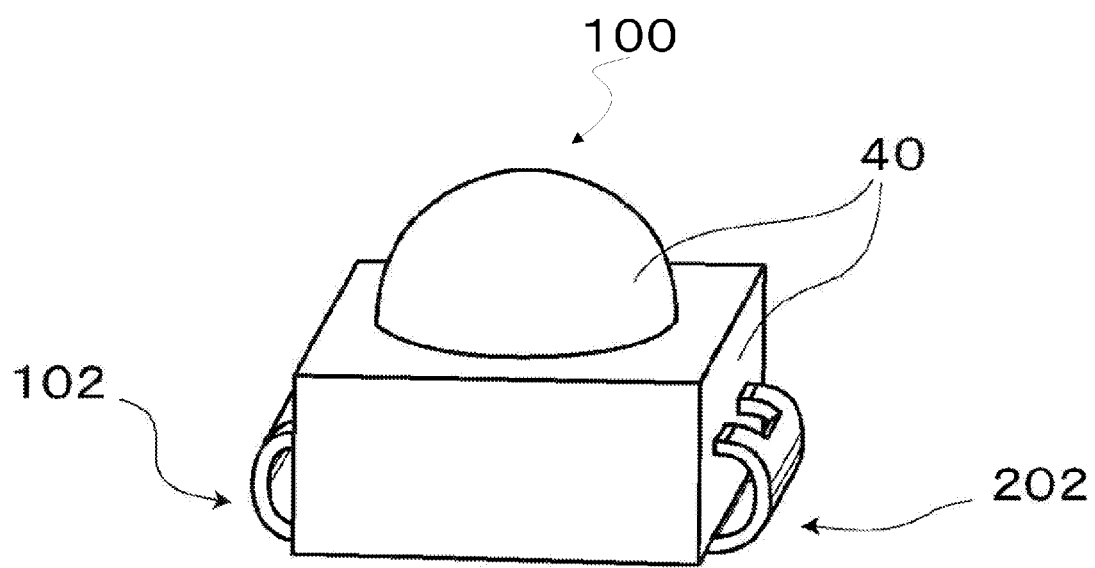

As shown in FIG. 1C, a first resin 38, which is substantially optically transparent to light from the semiconductor light emitting element 30, is provided in the recess portion 110 of the inner lead 106. The first resin 38 is provided on the semiconductor light emitting element 30. The first resin 38 may be an epoxy resin, an acryl resin, a silicone resin or the like. It may be preferable that the first resin 38 has a good adhesiveness to the semiconductor light emitting element 30.

In this embodiment, "substantially optically transparent" may be defined as the optical loss of the light from the light from the semiconductor light emitting element 30 is minimal to no loss by the resin. A "substantially optically transparent" resin may include materials that modify the overall transparent nature of the resin. For example, phosphors or other materials may be added to modify a color of the light as known in the art. While the phosphors or other materials may reduce the transparentness of the resin, for the purposes of this description, "substantially optically transparent" is intended to encompass these resins.

"Optical" may include at least one of visible light, IR light, and UV light.

A filler 36 is dispersed in the first resin 38. The filler 36 may be a silica, an alumina, a plastic or the like, which is an optically transparent. The average grain size may be 100 micrometers. When the average grain size is more than 100 micrometers, the grain size is close to the thickness of the semiconductor light emitting element 30. So it may be difficult that filler 36 is dispersed uniformly in the first resin 38 if the average grain size is more than 100 micrometers.

The first resin 38 is covered with the second resin 40. The first resin 38 may be made by potting a liquid state resin. The second resin 40 may be made mold forming after the first resin 38 is in semi cure state. Namely, the first resin 38 has a post reaction part when the second resin 40 is provided. So, the adhesiveness of the first resin 38 and the second resin 40 is improved. A peeling between the first resin 38 and the second resin 40 may be reduced.

It may be preferable that the second resin 40 is optically transparent. The second resin 40 may be an epoxy resin, an acryl resin, a silicone resin or the like. The second resin 40 may be made by transfer mold. A curved surface 41 is provided on the upper surface of the second resin 40. The curved surface 41 has a protrusion toward upside as shown in FIG. 1B. The curved surface 41 functions as focusing the light from the semiconductor light emitting element 30. Luminosity on the optical axis of the semiconductor light emitting device 100 may be improved.

The semiconductor light emitting device 100 may be mounted on a circuit board by reflow as surface mount.

The semiconductor light emitting device may be manufactured by a multi cavity lead frame. In the multi cavity lead frame, a plurality of the first leads 10 and the second leads 20 are provided and connected each other. Mounting process, wire bonding process, potting a resin process, transfer mold process or the like is operated in the multi cavity lead frame state. After curing the second resin, the outer lead of the semiconductor light emitting device is cut, the plurality of lead frames are separated and the outer lead is bent. In these processes, the plurality of the semiconductor light emitting devices is connected to the multi cavity lead frame via the support pin 103.

Next, a coefficient of thermal expansion ratio of the components in the semiconductor light emitting device 100 is explained.

The first lead 10 and the second lead 20 may be made of Cu based metal or Fe based metal. A coefficient of the thermal expansion ratio of Cu is about $1.7 \times 10^{-5}$/Centigrade. A coefficient of the thermal expansion ratio of Fe is about $1.2 \times 10^{-5}$/Centigrade. A coefficient of the thermal expansion ratio of epoxy resin is about $6.3 \times 10^{-5}$/Centigrade, which is about 3.7 times than that of Cu and is about 5.2 times. A coefficient of the thermal expansion ratio of GaN is about $3.17 \times 10^{-6}$/Centigrade, which is one twenties times than that of the epoxy resin. A coefficient of the thermal expansion ratio of a silica, which may be used as the filler 36, is about $7.0 \times 10^{-6}$/Centigrade, which is one tens times than that of the epoxy resin.

In case the filler 36 is provided in the first resin 38, a difference of the thermal expansion ratio in the recess portion 110 may be decreased. So the stress to the semiconductor light emitting element 30 and wiring 32 may be decreased. A peeling, cracking, splitting of the semiconductor light emitting element 30 or wiring 32 may be decreased. Furthermore, a low viscosity of the first resin with may be obtained by the silica.

A stress between the first resin 38, the second resin 40 and the leads 10 and 20 may be decreased by the anchor hole 107. So a peeling, cracking, splitting of the semiconductor light emitting element 30 or wiring 32 may be decreased.

Next, a first resin 38 is explained.

In case the first resin 38 is cured completely before providing the second resin 40, a peeling no less than 10 micrometers may occur at the boundary between the first resin 38 and the second resin 40. In case a resin for transfer mold is used as the first resin 38, a peeling may occur at the boundary between the first resin 38 and the second resin 40 by a mold release agent included in the resin for transfer mold. A luminosity or directivity of the light from the semiconductor light emitting device may be worsened by the peeling. A peeling, cracking, splitting of the semiconductor light emitting element 30 or wiring 32 may occur by the peeling. So it may be preferable that the adhesiveness between the first resin 38 and the second resin 40 is good.

In case the first resin 38 is semi cured before providing the second resin 40, a peeling at the boundary between the first resin 38 and the second resin 40 is hardly occur. One semi cure condition is 100-160 Centigrade in temperature and 30 minutes to 2 hours, when a liquid epoxy resin is semi cured. When the second resin 40 is applied on the semi cured first resin 38, the peeling at the boundary may be reduced. So worsening of the luminosity or the directivity of the semiconductor light emitting device may be reduced.

Table 1 is a result of a heat cycle test. The number of samples under the heat cycle test is 10. The sample semiconductor light emitting device is applied a heat hummer from −40 Centigrade to 110 Centigrade for 100, 200 and 300 times, respectively.

TABLE 1

| Amount of Filler | Number of Illumination Failures After Heat Cycles | | | |
|---|---|---|---|---|
| (by wt %) | 100 Cycles | 200 Cycles | 300 Cycles | Total |
| 0 | 1 | 2 | 3 | 6 |
| 50 | 0 | 0 | 1 | 1 |

Heat cycle: −40° ↔ 110° C.
Number of Samples: 10

Table 2 is a result of a moisture reflow test. The number of samples under the moisture reflow test is 10. The sample semiconductor light emitting device is applied moisture and 260 Centigrade reflow for 1, 2, 3, 5, 8, and 10, respectively.

TABLE 2

| Amount of Filler | Number of Illumination Failures After Moisture Reflow Cycles | | | | | |
|---|---|---|---|---|---|---|
| (by wt %) | 1 | 2 | 3 | 5 | 8 | 10 | Total |
| 0 | 0 | 0 | 0 | 3 | 0 | 1 | 4 |
| 50 | 0 | 0 | 0 | 0 | 0 | 0 | 0 |

Moisture Reflow: Moisture + 260° C. Reflow
Number of Samples: 10

As shown in Table 1 and 2, a stress may be reduced by the filler 36.

Figure 2A:
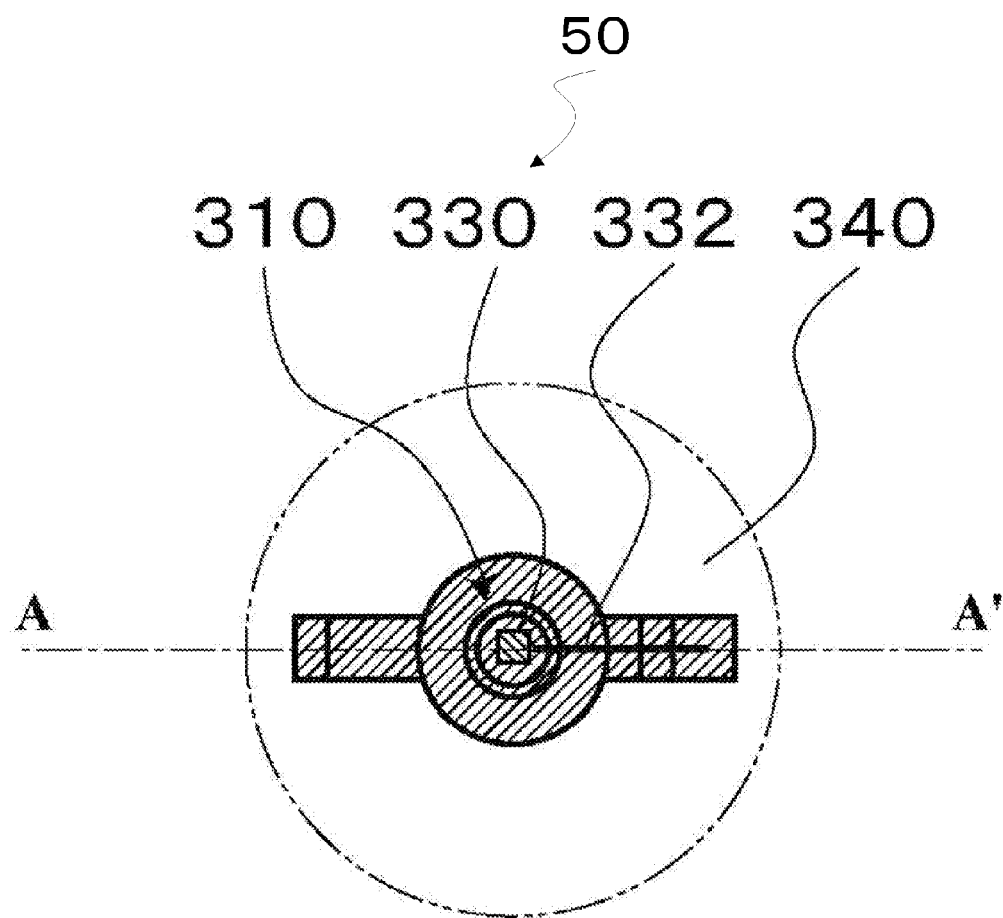
Figure 2B:
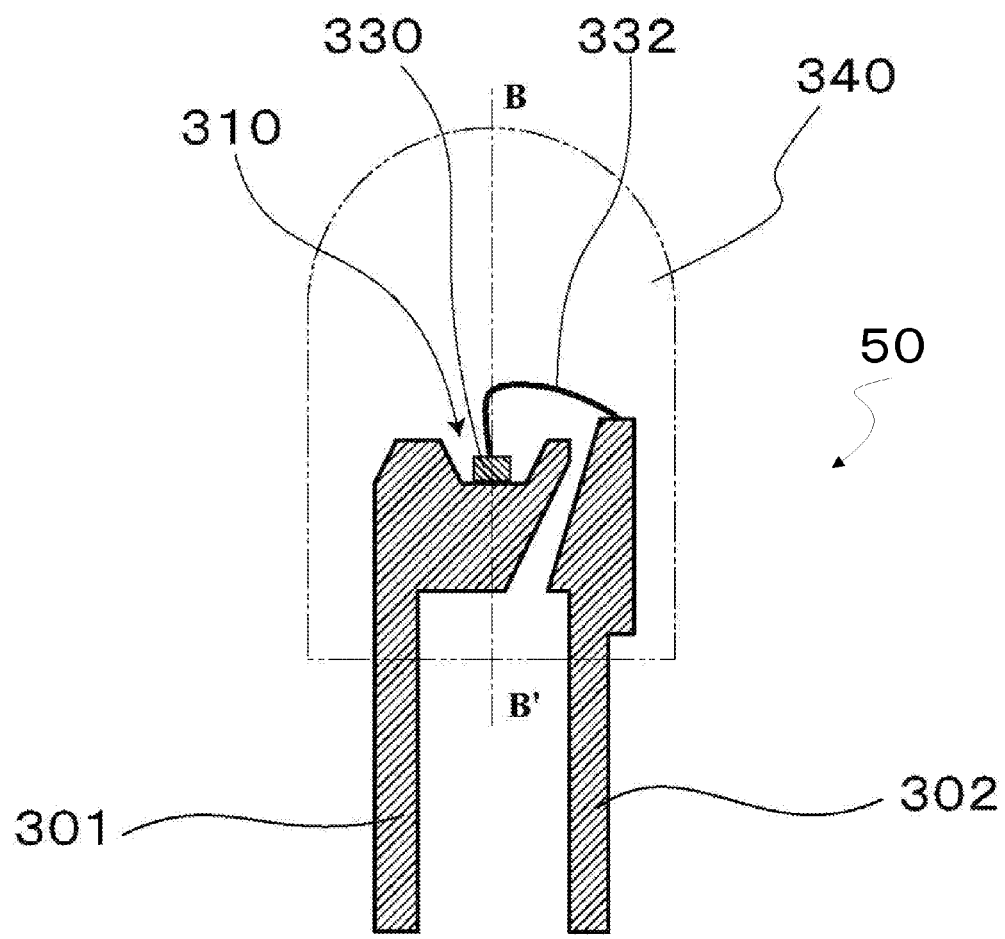
Figure 2C:
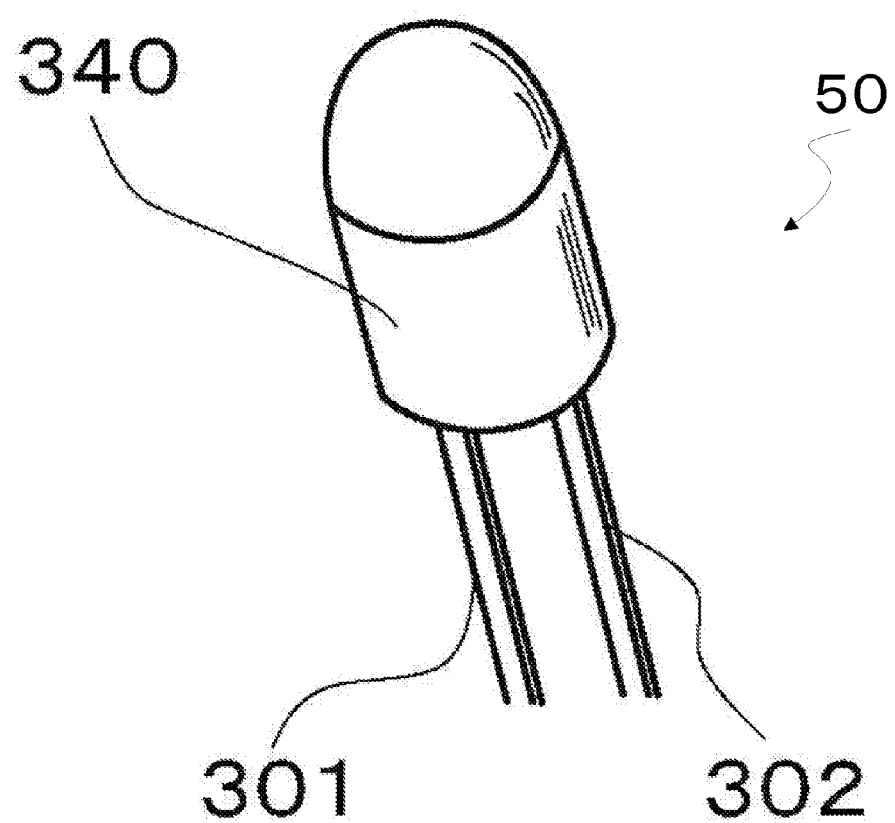

Next, a comparative example is explained with reference to FIGS. 2A, 2B and 2C. FIGS. 2A-2C show a semiconductor light emitting device 50 in accordance with a comparative example.

In the semiconductor light emitting device 50, a cup shape portion 310 is provided in a first lead 301. A semiconductor light emitting element 330 is mounted on the bottom portion of the cup shape portion 310. A wiring 332 is connected the semiconductor light emitting element 330 and a second lead 302. The first lead 301, the second lead 302, the semiconductor light emitting element 330 and the wiring 332 is molded by a transparent resin 340. As shown in FIG. 2B, the semiconductor light emitting element 330 is asymmetric with B-B' line which pass the semiconductor light emitting element 330 and is vertical line. In this case, a center of the displacement by the heat stress is provided apart from the B-B' line. So a load from the heat stress may be maxim near the semiconductor light emitting element 330 and the wiring 332. In other words, the stress may be concentrated and added to the semiconductor light emitting element 330 and the wiring 332. So, a peeling, cracking, splitting of the semiconductor light emitting element 330 or wiring 332 may occur.

On the other hand, the semiconductor light emitting device 100 in accordance with this embodiment has a symmetric with the vertical line passing the semiconductor light emitting element 30. So a heat stress may be also symmetric with the vertical line B-B'. A center of the displacement by the heat stress may be provided near the vertical line B-B'. So a load from the heat stress may be dispersed in the semiconductor light emitting device 100 and large stress may be hardly provided to the semiconductor light emitting element 30 and the wiring 32. So, a peeling, cracking, splitting of the semiconductor light emitting element 30 or wiring 32 may hardly occur.

In the first embodiment, a wiring 32 is provided in a direction, which is angled α (0<α≦90°) from the direction to which the second lead 20 is extended. The direction, to which the second lead 20 is extended, is a direction which the displacement by the heat stress may be large. So the direction, to which the wiring 32 runs, is apart from the direction to which the second lead 20 is extended. So, a heat stress to the wiring 32 may be reduced by being angled α.

A stress to a bottom surface of the semiconductor light emitting element 30 will be explained with reference to FIG. 3.

Figure 3A:
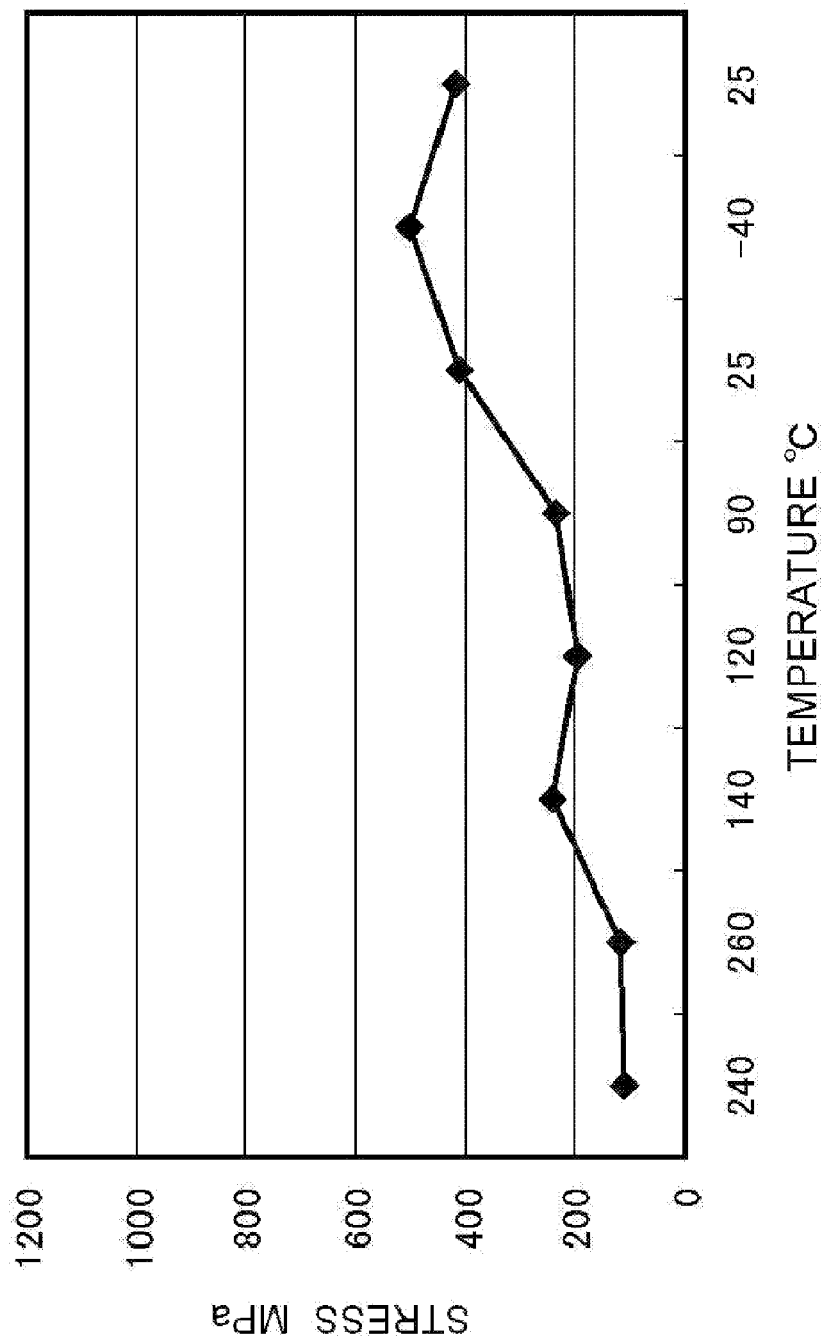
FIG. 3A is a diagram showing a stress on a bottom surface of a semiconductor light emitting element in accordance with the first embodiment.
Figure 3B:
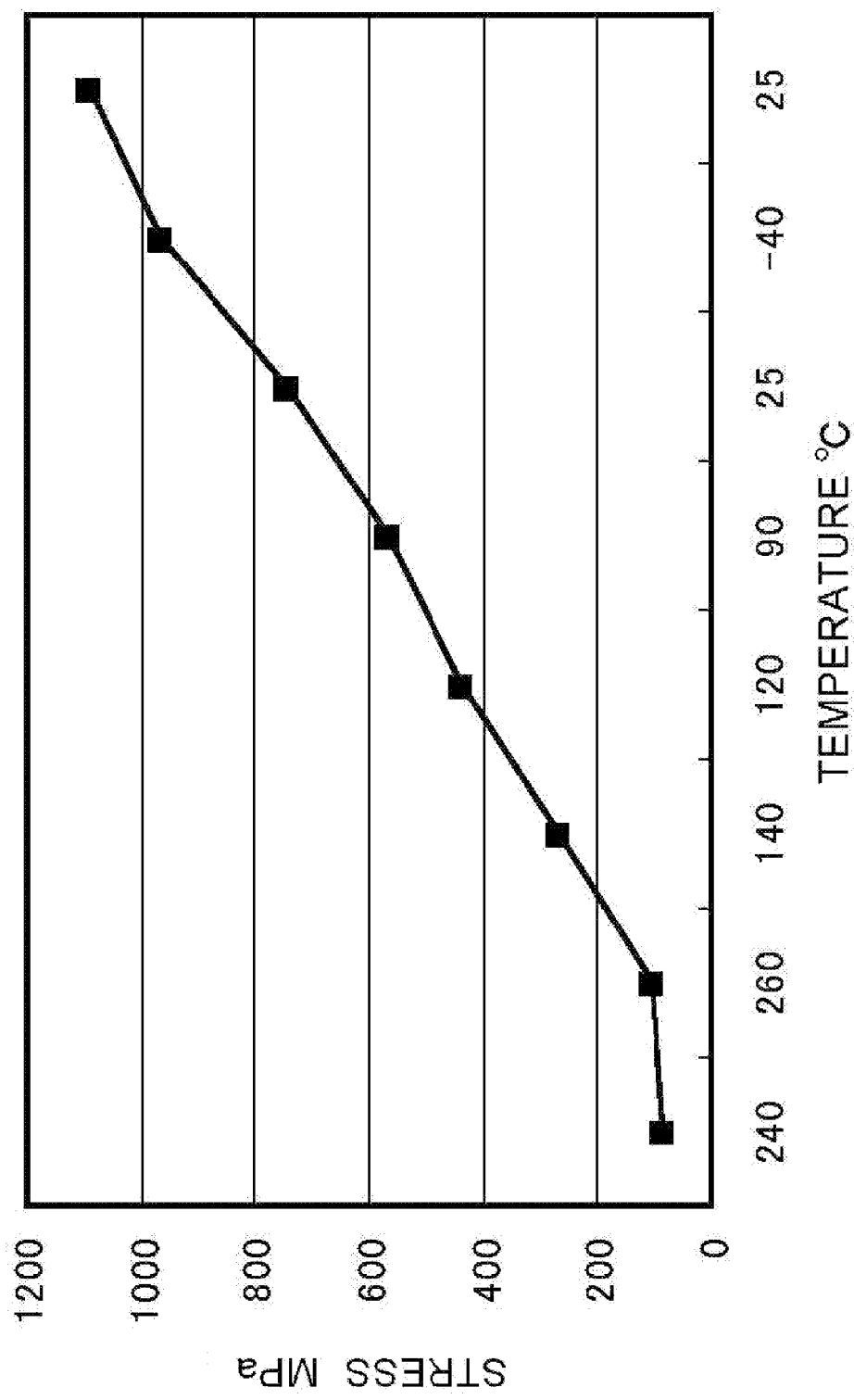
FIG. 3B is a diagram showing a stress on a bottom surface of a semiconductor light emitting element in accordance with the comparative example.

FIG. 3A is a diagram showing a stress on a bottom surface of the semiconductor light emitting element 30 in accordance with the first embodiment. FIG. 3B is a diagram showing a stress on a bottom surface of the semiconductor light emitting element 330 in accordance with the comparative example.

As shown in FIG. 3A, in the first embodiment, the stress is at the maximum value, about 500 MPa at about −40 Centigrade. On the other hand, in the comparative example, as shown in FIG. 3B, the stress is at the maximum value about 1080 MPa about 25 Centigrade. In the comparative example, the stress is increased with the temperature is decreased. The maxim stress to the bottom surface of the semiconductor light emitting element 330 in the comparative example is about 2.2 times larger than the maximum stress to the semiconductor light emitting element 30 in the first embodiment.

Next, a breaking of the wiring is explained with reference to Table 3. Table 3 is a result of a breaking test of a Au wiring of a temperature cycle test. In the test, temperature cycle is operated 1000 times. The temperature cycle test is operated from −40 Centigrade to 110 Centigrade. The number of samples is 100.

conductor light emitting device 105 in accordance with the modification of the first embodiment.

Figure 4A:
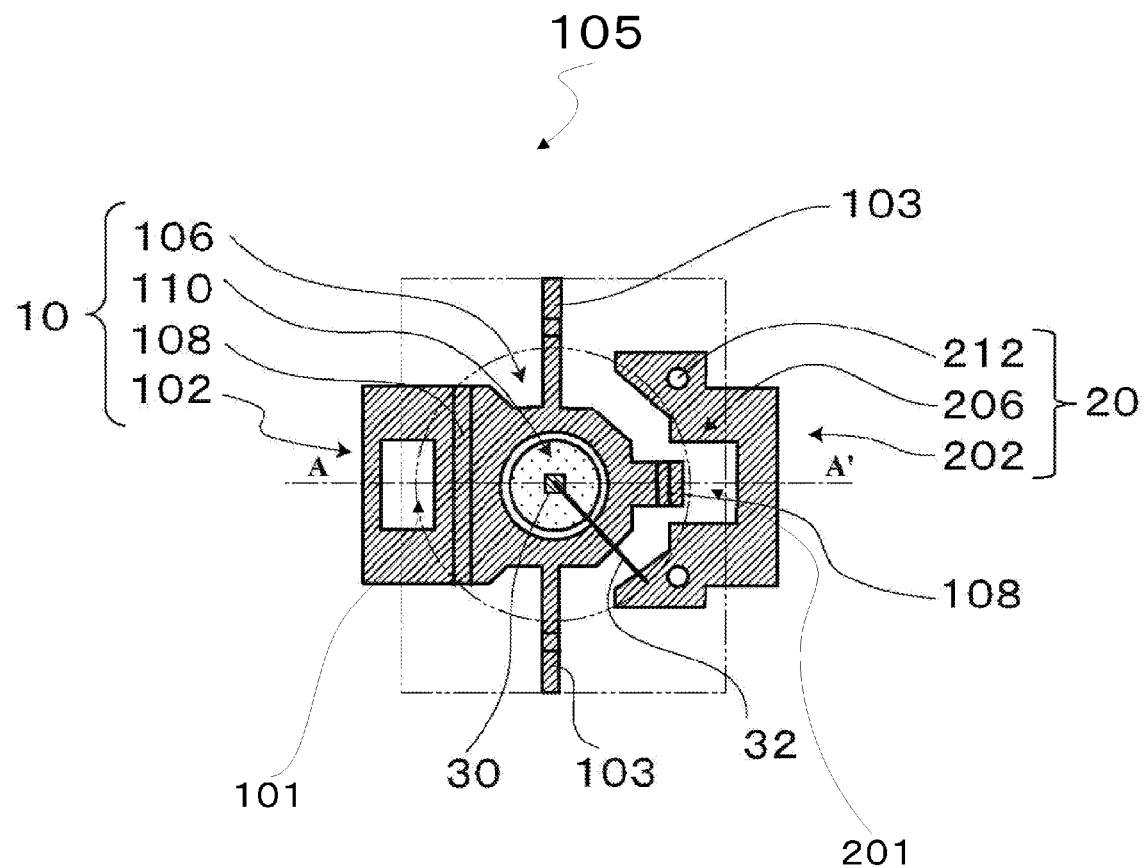
FIG. 4A is a plane view of a semiconductor light emitting device in accordance with a modification of the first embodiment.

In this modification, two round holes 212 are provided in the inner lead 206 of the second lead 20. The holes 212 are penetrated through the lead. The holes 212 are symmetric with A-A' line as shown in FIG. 4A. The hole 212 may function as an anchor hole and a second resin 40 is provided in the hole 212. So it may be available that the second lead 20 is hardly pulled out from the second resin 40.

SECOND EMBODIMENT

A second embodiment is explained with reference to FIGS. 5A-6B.

Figure 5A:
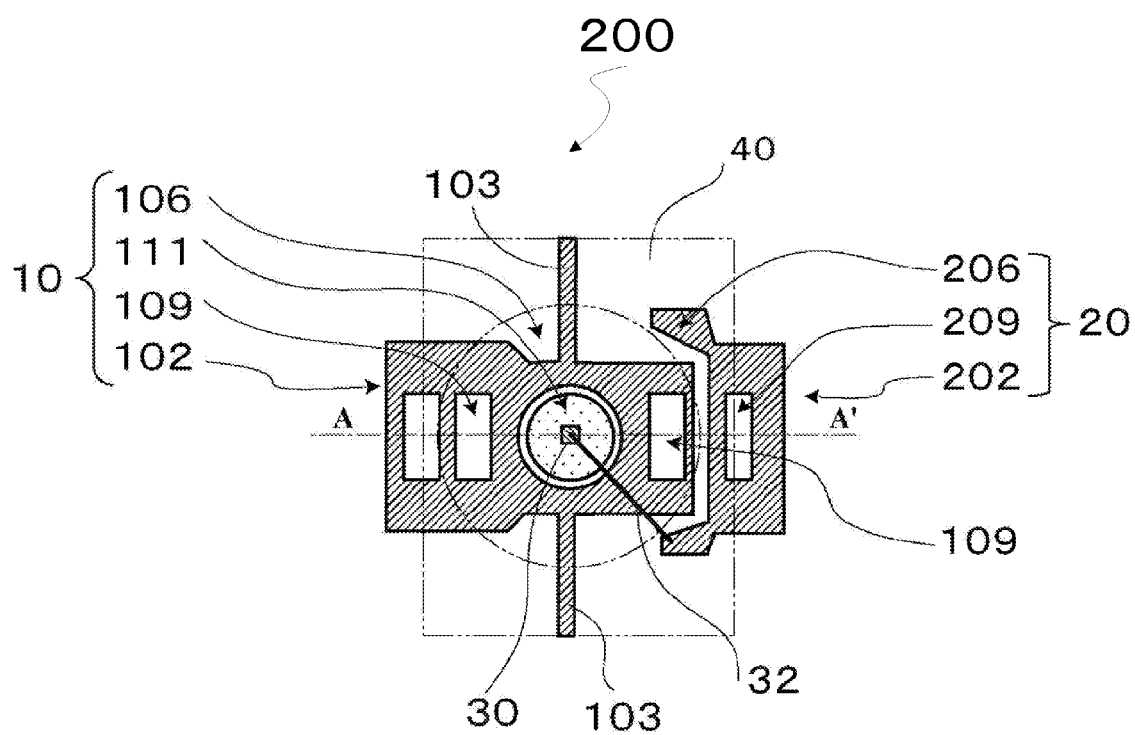
FIG. 5A is a plane view of a semiconductor light emitting device in accordance with a second embodiment.
Figure 5B:
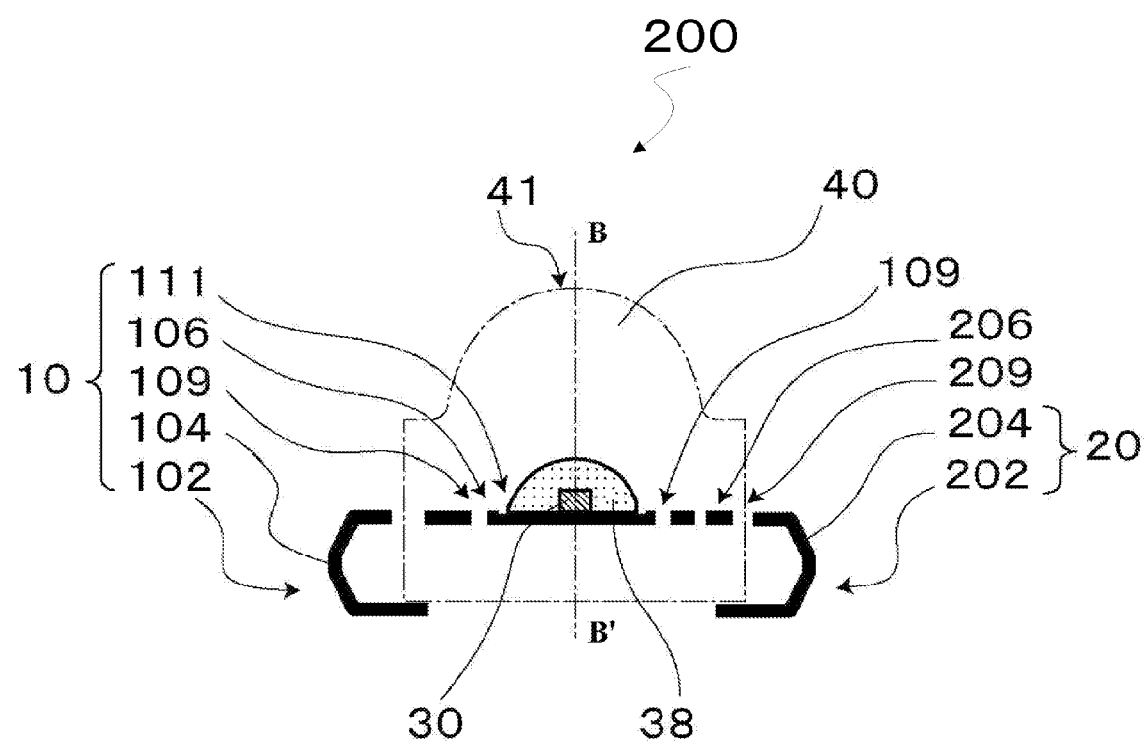
FIG. 5B is a cross-sectional view of the semiconductor light emitting device in accordance with the second embodiment.

A semiconductor light emitting device 200 is described in accordance with a second embodiment. FIG. 5A is a plane view of a semiconductor light emitting device 200 in accordance with a second embodiment. FIG. 5B is a cross-sectional view of the semiconductor light emitting device 200 in accordance with the second embodiment.

In this second embodiment, a recess portion is not provided in the first lead 10. A trench 111 is provided around the semiconductor light emitting element 30. The first resin 38 having filler 36 is not flown to the outside of the trench 111.

A rectangular opening 109 is provided in the first lead 10. One of the rectangular opening 109 is provided at the right side of the semiconductor light emitting element 30 and another rectangular opening 109 is provided at the left side of the semiconductor light emitting element 30. The rectangular openings are apart the same distance from the semiconductor light emitting element 30. As shown in FIG. 5B, the width of the openings 109 may be substantially same. So a center of the displacement by the heat stress is provided near from the B-B' line. So a center of the displacement by the heat stress may be provided near the vertical line B-B'. So a load from the heat stress may be dispersed in the semiconductor light emitting device 200 and large stress may be hardly provided to the semiconductor light emitting element 30 and the wiring 32. So, a peeling, cracking, splitting of the semiconductor light emitting element 30 or wiring 32 may hardly occur.

A rectangular opening 209 is provided in the second lead 20. The rectangular opening 209 is penetrated through the lead. The rectangular opening 209 may function as an anchor hole and a second resin 40 is provided in a part of the rectan-

TABLE 3

| | Number of Cycles | | | | | | | | | | |
|---|---|---|---|---|---|---|---|---|---|---|---|
| | Initial | 100 | 200 | 300 | 400 | 500 | 600 | 700 | 800 | 900 | 1000 |
| Structure of First Embodiment | 0 | 0 | 0 | 0 | 0 | 0 | 0 | 0 | 0 | 0 | 0 |
| Comparative Example | 0 | 0 | 0 | 0 | 0 | 0 | 0 | 1 | 0 | 1 | 0 |

In the comparative example, one breaking of the wiring 332 occurs after 700 cycles and one breaking of the wiring 332 occurs after 900 cycles. On the other hand, the wiring 32 of the semiconductor light emitting device 100 in the first embodiment, does not occur after 1000 cycles. So, the breaking of wiring 32 in the first embodiment is reduced with comparing to that in the comparative example.

Figure 4B:
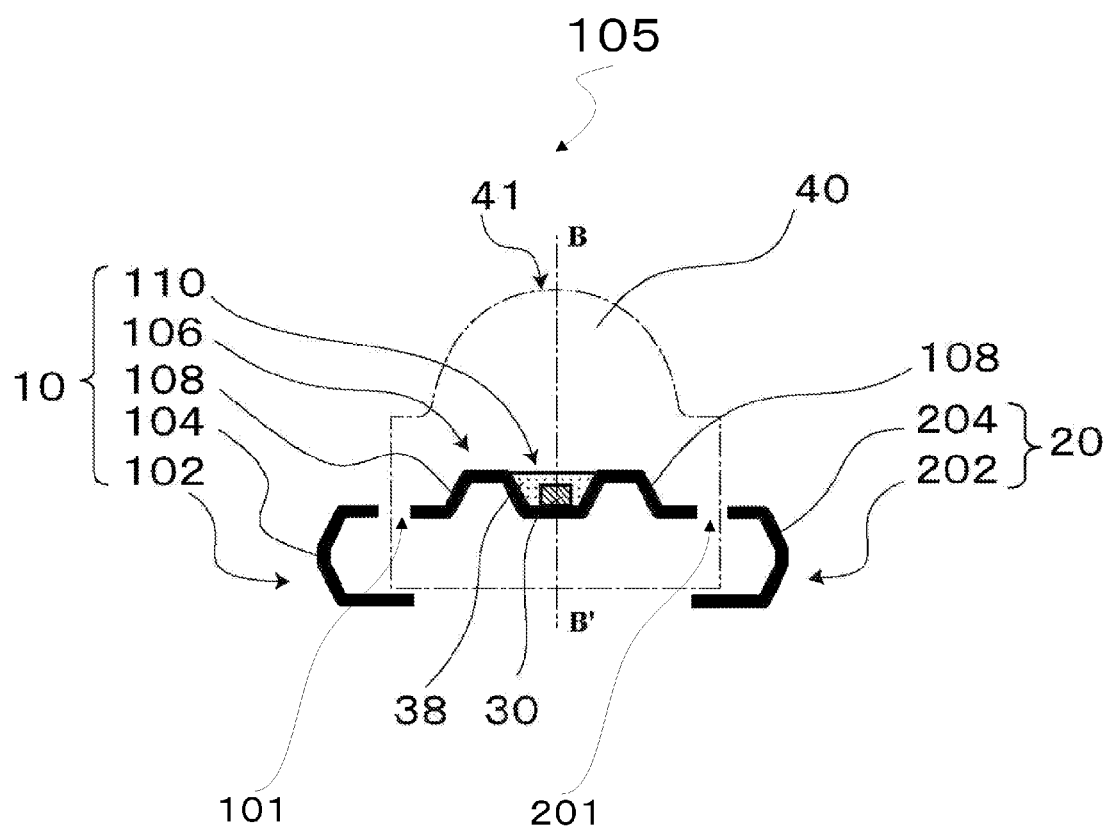
FIG. 4B is a cross-sectional view of the semiconductor light emitting device in accordance with the modification of the first embodiment.

Next, a modification of the first embodiment will be explained with reference to FIGS. 4A and 4B.

FIG. 4A is a plane view of a semiconductor light emitting device 105 in accordance with a modification of the first embodiment. FIG. 4B is a cross-sectional view of the semigular opening 209. So it may be available that the second lead 20 is hardly pulled out from the second resin 40.

Next, a modification of the second embodiment will be explained with reference to FIGS. 6A and 6B.

Figure 6A:
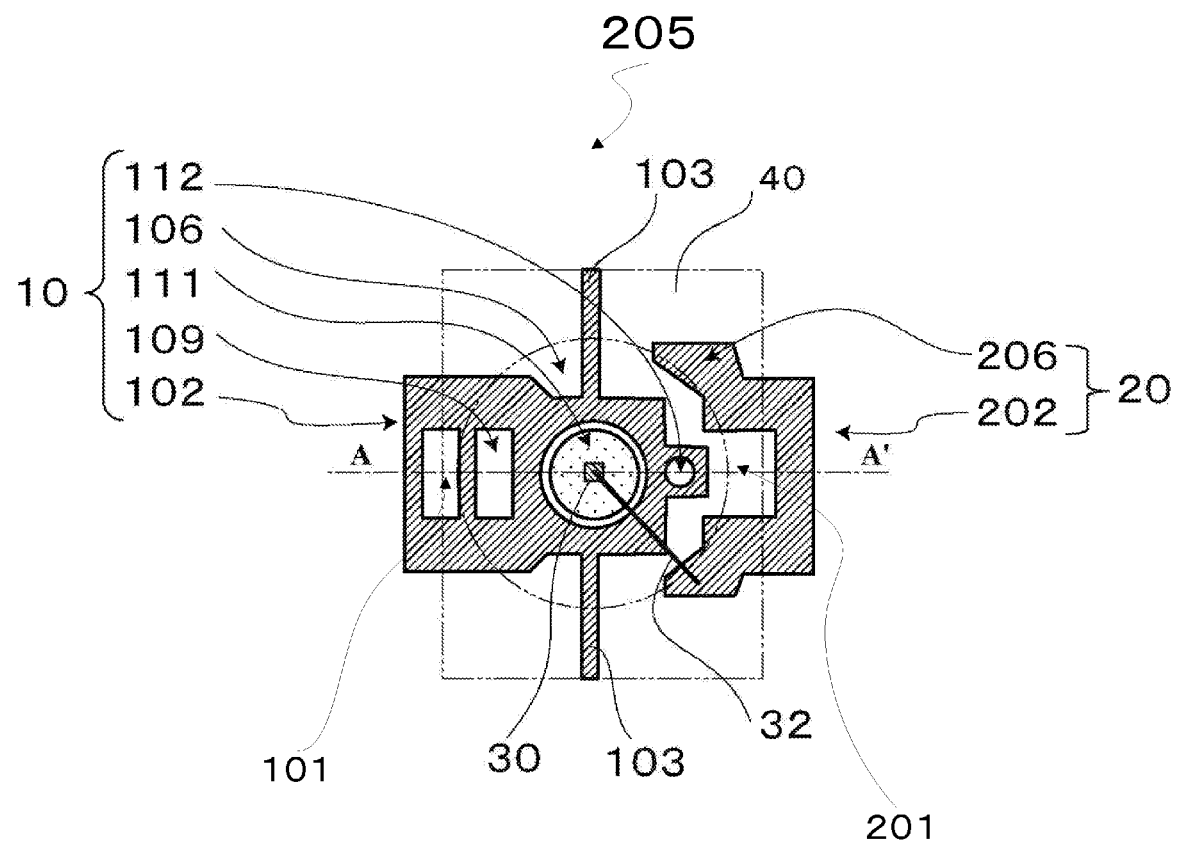
FIG. 6A is a plane view of a semiconductor light emitting device in accordance with a modification of the second embodiment.
Figure 6B:
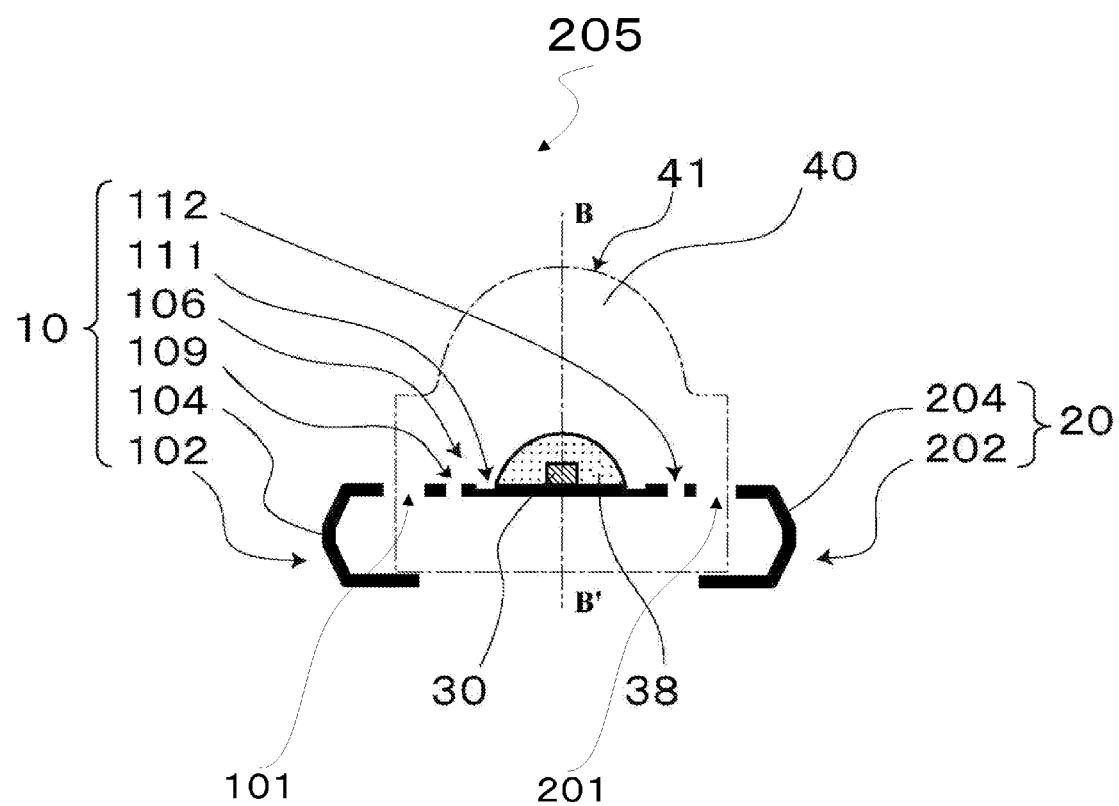
FIG. 6B is a cross-sectional view of the semiconductor light emitting device in accordance with the modification of the second embodiment.

FIG. 6A is a plane view of a semiconductor light emitting device 205 in accordance with a modification of the second embodiment. FIG. 6B is a cross-sectional view of the semiconductor light emitting device 205 in accordance with the modification of the second embodiment.

In this modification, a round opening 112 is provided in the first lead 10 instead of rectangular opening 109 at the right side of the semiconductor light emitting element 30. The round opening 112 and the rectangular opening 109 are apart substantially same distance from the semiconductor light emitting element 30. The width of the round opening 112 and the width of the rectangular opening 109 are substantially same as shown in FIG. 6B. The round opening 112 and the rectangular opening 109 are symmetric with the vertical line B-B'. So the stress to the semiconductor light emitting element 30 may be reduced. It may be available that the second lead 10 is hardly pulled out from the second resin 40.

THIRD EMBODIMENT

A third embodiment is explained with reference to FIGS. 7A-8B.

Figure 7A:
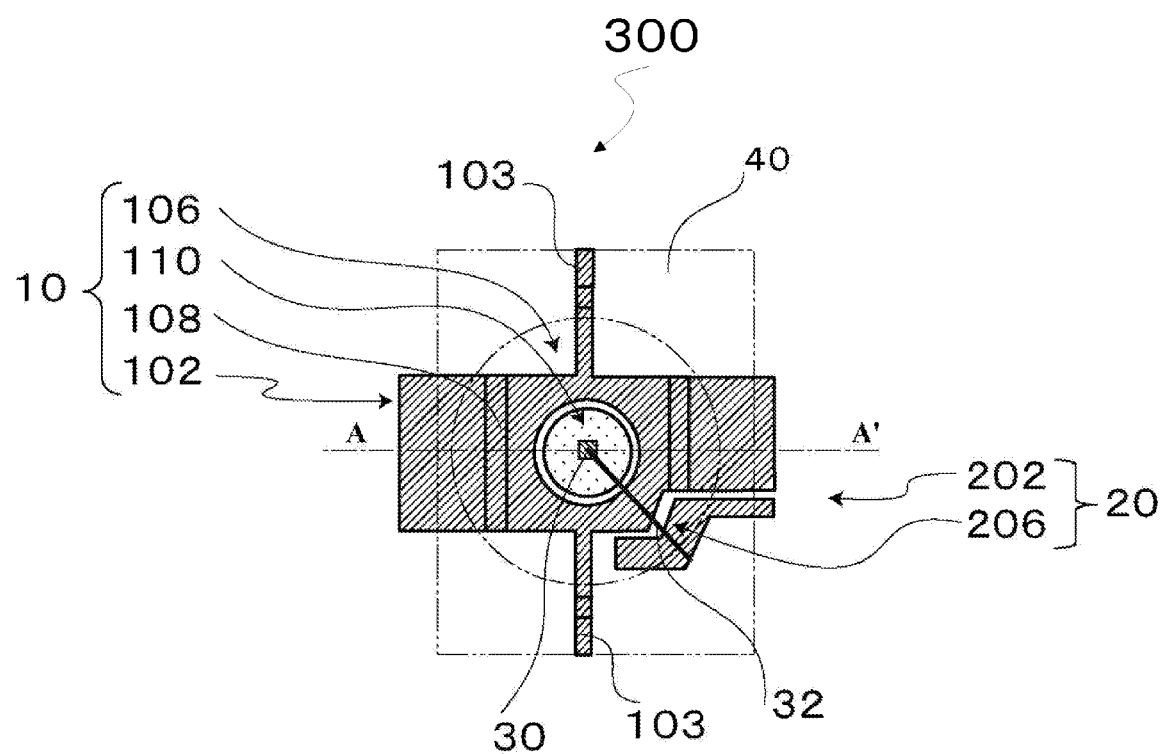
FIG. 7A is a plane view of a semiconductor light emitting device in accordance with a third embodiment.
Figure 7B:
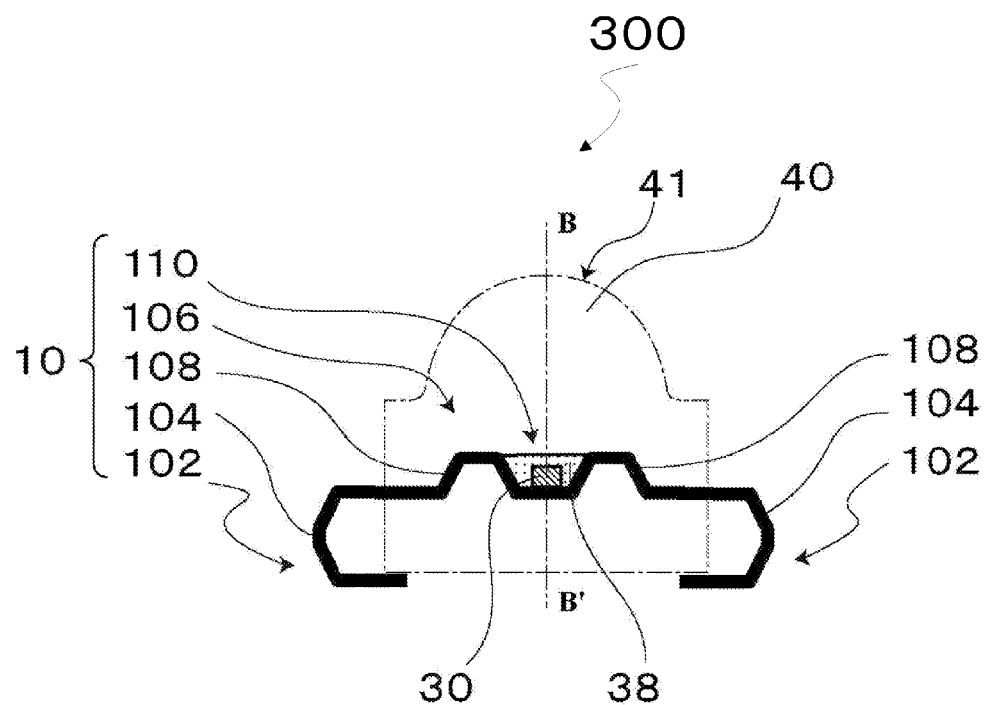
FIG. 7B is a cross-sectional view of the semiconductor light emitting device in accordance with the third embodiment.

A semiconductor light emitting device 300 is described in accordance with a third embodiment. FIG. 7A is a plane view of a semiconductor light emitting device 300 in accordance with a third embodiment. FIG. 7B is a cross-sectional view of the semiconductor light emitting device 300 in accordance with the third embodiment.

In this third embodiment, bent portions 108 are provided being apart same distance from the semiconductor light emitting element 30. The bent portions 108 are symmetric with the vertical line B-B'. As shown in FIG. 7B, the first lead 10 is symmetric with the vertical line B-B'. The J bend portions 104 provided both sides are symmetric with the vertical line B-B' as shown in FIG. 7B. The stress toward the direction to which the first lead 10 is extended, may be decreased. So the center of the displacement may be provided near the vertical line B-B'.

As shown in FIG. 7A, the second lead 20 is provided apart from the first lead. The second lead 20 is connected to the semiconductor light emitting element 30 which is mounted on the first lead 10.

Next, a modification of the third embodiment will be explained with reference to FIGS. 8A and 8B.

Figure 8A:
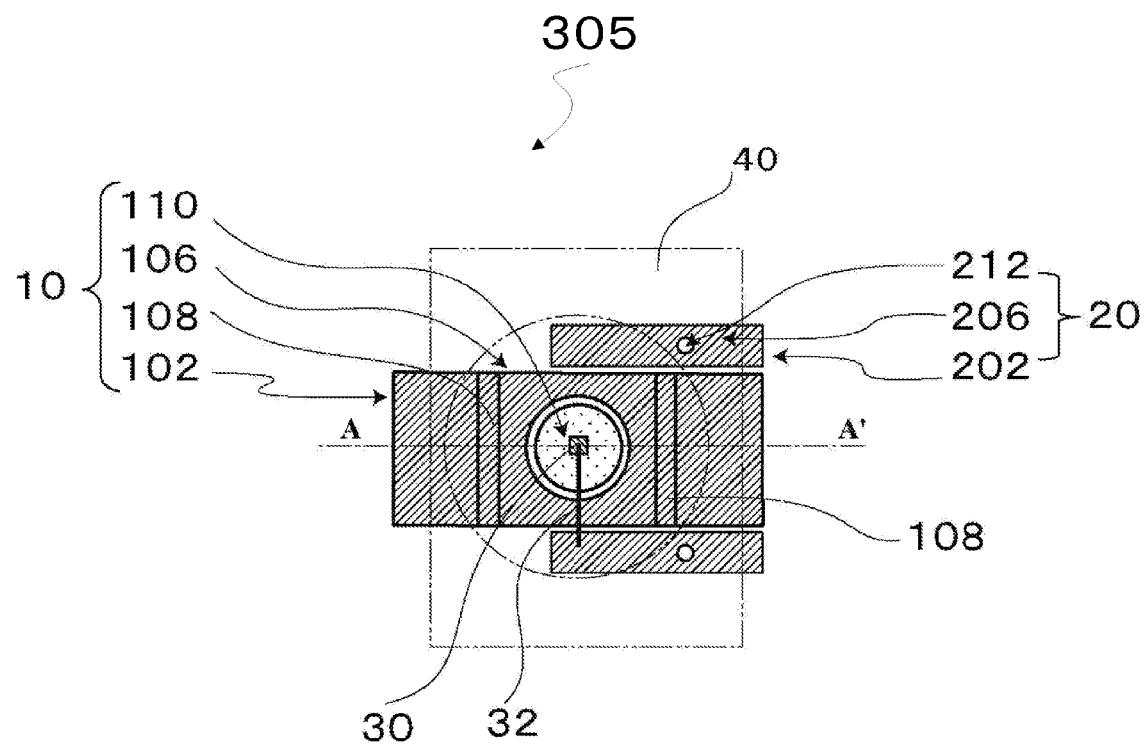
FIG. 8A is a plane view of a semiconductor light emitting device in accordance with a modification of the third embodiment.
Figure 8B:
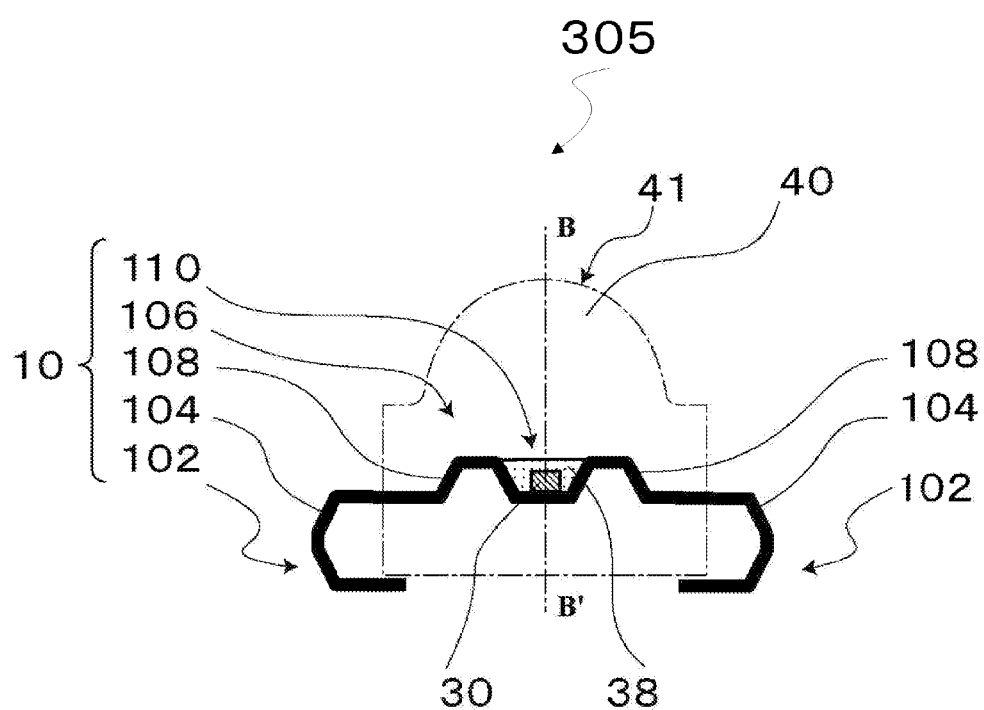
FIG. 8B is a cross-sectional view of the semiconductor light emitting device in accordance with the modification of the third embodiment.

FIG. 8A is a plane view of a semiconductor light emitting device 305 in accordance with a modification of the third embodiment. FIG. 8B is a cross-sectional view of the semiconductor light emitting device 305 in accordance with the modification of the third embodiment.

In this modification, a two second leads 20 are provided in the semiconductor light emitting device 40. One of the second leads 20 is provided on the upper side of the first lead 10 in FIG. 8A, and the other second lead 20 is provided on the lower side of the first lead 10 in FIG. 8B. The second leads 20 are symmetric with the vertical line B-B' in a cross section perpendicular to the direction to which the first lead 10 is extended.

Round holes 212 are provided in the inner leads 206 of the second leads 20, respectively. The holes 212 are penetrated through the lead. The holes 212 are symmetric with the vertical line B-B' in a cross section perpendicular to the direction to which the first lead 10 is extended. The hole 212 may function as an anchor hole and a second resin 40 is provided in the hole 212. So it may be available that the second lead 20 is hardly pulled out from the second resin 40.

FOURTH EMBODIMENT

A fourth embodiment is explained with reference to FIGS. 9A and 9B

A semiconductor light emitting device 400 is described in accordance with a fourth embodiment. FIG. 9A is a plane view of a semiconductor light emitting device 400 in accordance with a fourth embodiment. FIG. 9B is a cross-sectional view of the semiconductor light emitting device 400 in accordance with the fourth embodiment.

Figure 9A:
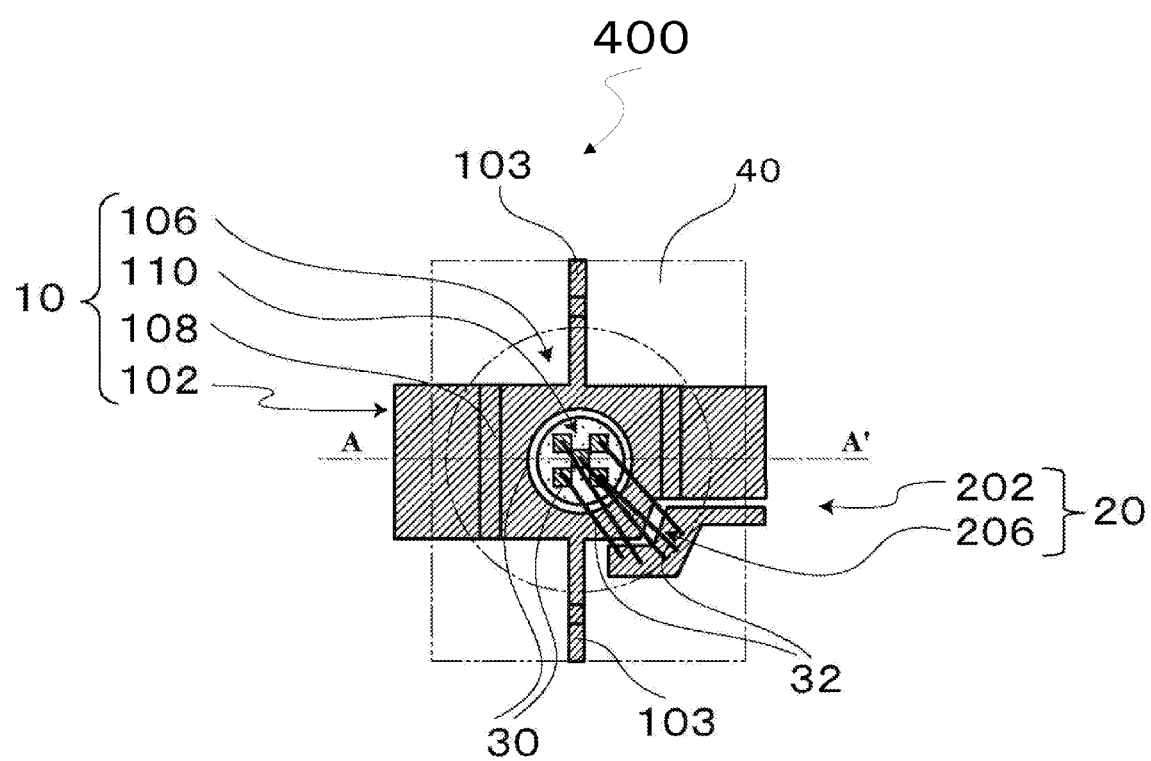
FIG. 9A is a plane view of a semiconductor light emitting device in accordance with a fourth embodiment.
Figure 9B:
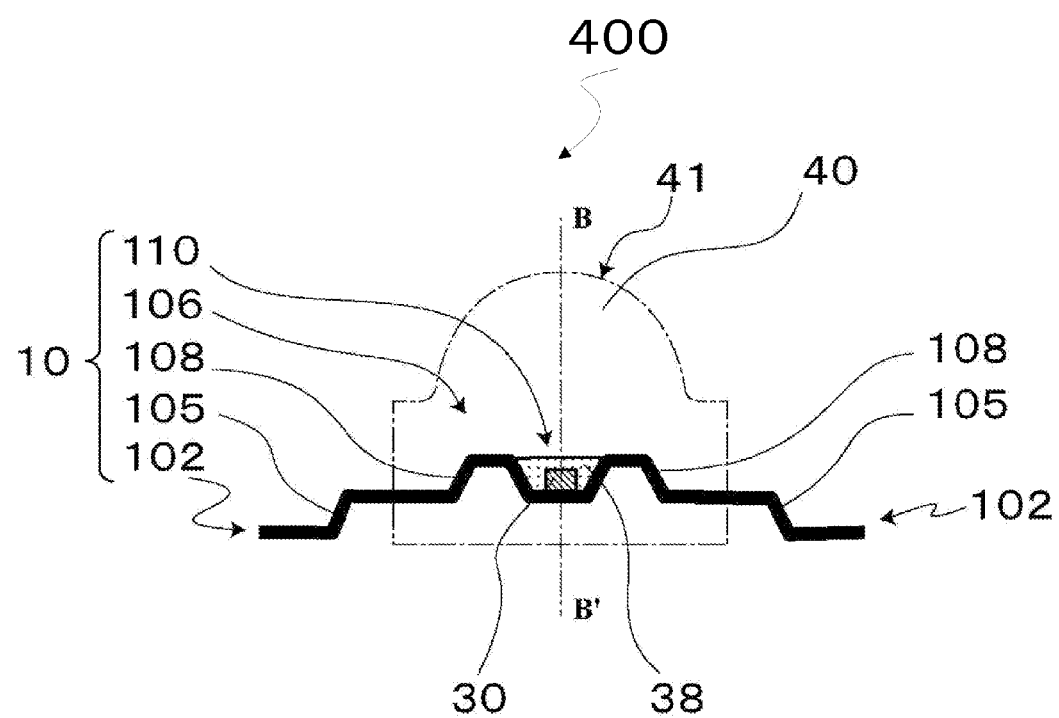
FIG. 9B is a cross-sectional view of the semiconductor light emitting device in accordance with the fourth embodiment.

In this fourth embodiment, as shown in FIG. 9B, the outer lead 102 has a step shape bent portion 105 instead of J bend portion 104. A stress to the second resin 40 may be reduced during or after a manufacturing process. So the thickness of the second resin 40 provided below the semiconductor light emitting element 30 may be reduced. Thus the thickness of the semiconductor light emitting device 400 may be reduced, and the heat dissipation ratio may be improved.

As shown in FIG. 9A, five semiconductor light emitting element 30 may be provided on the first lead. High luminosity may be obtained.

FIFTH EMBODIMENT

Figure 10A:
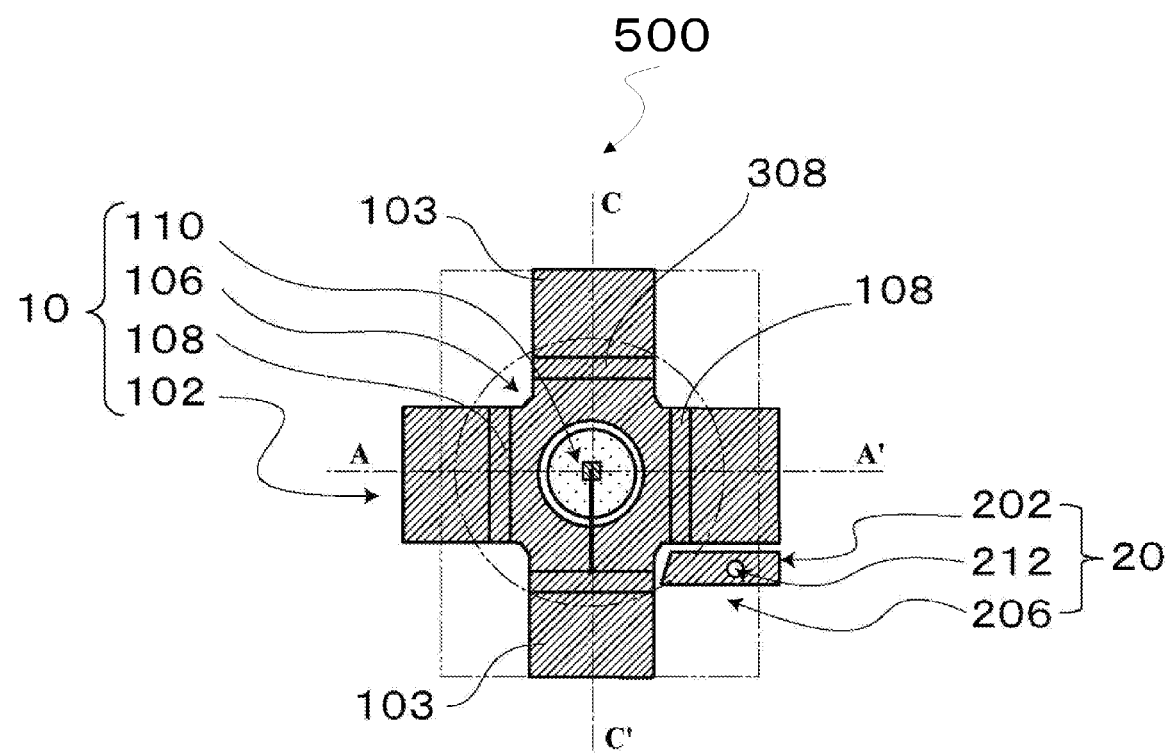
FIG. 10A is a plane view of a semiconductor light emitting device in accordance with a fifth embodiment.
Figure 10B:
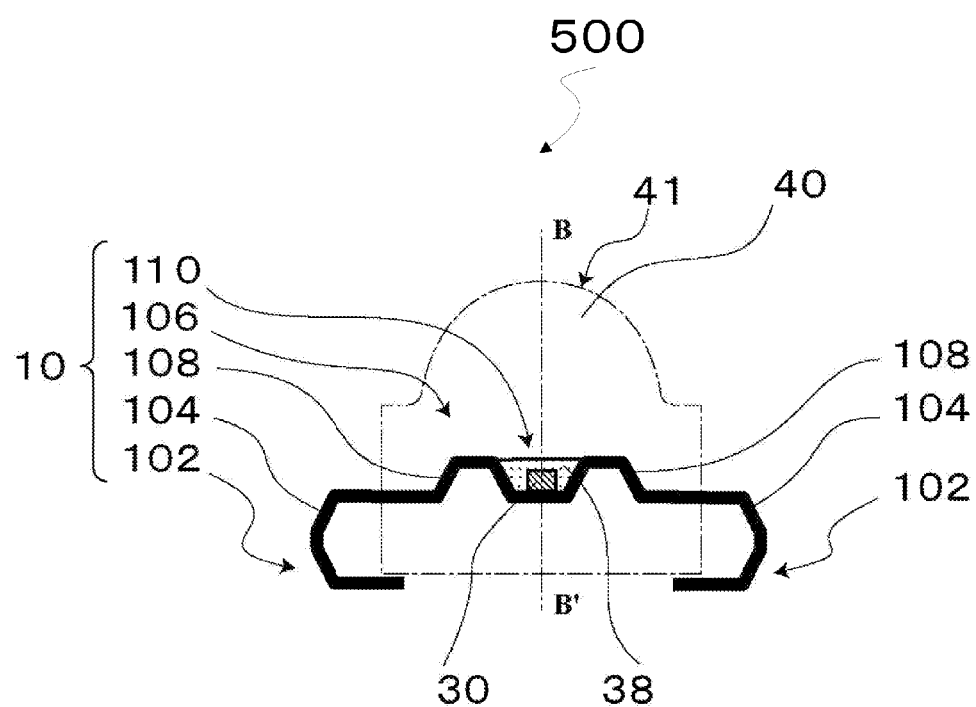
FIG. 10B is a cross-sectional view of the semiconductor light emitting device in accordance with the fifth embodiment.

A fifth embodiment is explained with reference to FIGS. 10A and 10B.

A semiconductor light emitting device 500 is described in accordance with a fifth embodiment. FIG. 10A is a plane view of a semiconductor light emitting device 500 in accordance with a fifth embodiment. FIG. 10B is a cross-sectional view of the semiconductor light emitting device 500 in accordance with the fifth embodiment.

In this fifth embodiment, the first lead 10 is extended toward A-A' line and C-C' line. Bent portions 108 are provided being apart same distance from the semiconductor light emitting element 30. Bent portions 108 are symmetric with the vertical line B-B' in the cross-sectional view passing the A-A' line. Bent portions 308 are provided being apart same distance from the semiconductor light emitting element 30. Bent portions 308 are symmetric with the vertical line B-B' in the cross-sectional view passing C-C' line. So stress along the two direction A-A' line and C-C' line may be reduced.

As mentioned above, in the semiconductor light emitting device in accordance with the first to fifth embodiments and their modifications, a stress to the semiconductor light emitting element 30 and the wiring 32 may be reduced.

OTHER EMBODIMENTS

Embodiments of the invention have been described with reference to the examples. However, the invention is not limited thereto.

For example, the material of the LED chip is not limited to InGaAlP-based or GaN-based semiconductors, but may include various other Group III-V compound semiconductors such as GaAlAs-based and InP-based semiconductors, or Group II-VI compound semiconductors, or various other semiconductors.

For example, the components in the first to fifth embodiments may be provided in other embodiments (for instance, elements of one embodiment may be used in another embodiment).

An anchor hole 212 or the like may be provided in the inner lead of the first lead and/or the second lead. A plurality of bent portion may be provided in the inner lead of the first lead.

Shape, size, number, material or the like of the semiconductor light emitting element, filler, first resin, second resin, leads and wiring may be changed.

Further, in another embodiment, the first and second resins may be replaced with a single resin where the formed resin is formed at a single time. In another embodiment, the first and second resins may be the same material but formed at different times.

Other embodiments of the present invention will be apparent to those skilled in the art from consideration of the specification and practice of the invention disclosed herein. It is intended that the specification and example embodiments be considered as exemplary only, with a true scope and spirit of the invention being indicated by the following.

What is claimed is:

1. A semiconductor light emitting device, comprising:
   a first lead having an upper surface, the first lead extending in a direction;
   a second lead provided apart from the first lead;
   a semiconductor light emitting element provided on and physically contacting the upper surface of the first lead;
   a wiring electrically connecting the semiconductor light emitting element and the second lead; and
   a first resin provided at least on and contacting the first lead and on and contacting the second lead, and being optically transparent to light from the semiconductor light emitting element, the first resin provided such that a portion of the first lead extends generally horizontally out from the resin,
   wherein a part of the first lead contacting the first resin is substantially symmetric about a vertical line passing through the semiconductor light emitting element in a cross-sectional view cut along a plane, the plane passing through the semiconductor light emitting element and being parallel with the direction in which the first lead extends from the first resin,
   wherein the first lead has an opening, and
   wherein a gap from the first lead to the second lead along the direction to which the first lead is extended is substantially equal to the width of the opening of the first lead in the cross-sectional view cut along a plane, the plane passing the semiconductor light emitting element and being parallel with a direction to which the first lead is extended.

2. A semiconductor light emitting device of claim 1, wherein the first resin is symmetric with respect to a vertical line passing through the semiconductor light emitting element in the cross-sectional view.

3. A semiconductor light emitting device of claim 1, wherein a part of the first lead which is provided outside of the first resin and a part of the second lead which is provided outside of the first resin are symmetric with a vertical line passing through the semiconductor light emitting element in the cross-sectional view.

4. A semiconductor light emitting device of claim 1, further comprising:
   a second resin being optically transparent to light from the semiconductor light emitting element, the second resin covering the semiconductor light emitting element and located below the first resin.

5. A semiconductor light emitting device of claim 4, wherein a filler which has a lower coefficient of thermal expansion ratio than the second resin is provided in the second resin.

6. A semiconductor light emitting device of claim 1, wherein the first lead has a plurality of bent portions, and the bent portions are apart a substantially same distance from the semiconductor light emitting element.

7. A semiconductor light emitting device of claim 1, wherein the first lead and the second lead are substantially symmetric with a vertical line passing through the semiconductor light emitting element in a cross-sectional view cut along a plane, the plane passing the semiconductor light emitting element and being parallel with a direction to which the first lead is extended.

8. A semiconductor light emitting device of claim 7, wherein the first lead has a plurality of bent portions, and the bent portions are apart a substantially same distance from the semiconductor light emitting element.

9. A semiconductor light emitting device of claim 6, wherein the bent portions are substantially symmetric with a vertical line passing through the semiconductor light emitting element in a cross-sectional view cut along a plane, the plane passing the semiconductor light emitting element and being parallel with a direction to which the first lead is extended.

10. A semiconductor light emitting device, comprising:
    a first lead including a concave portion between a first bent portion and a second bent portion, the first bent portion and second bent portion being angled downward away from each other;
    a second lead provided being apart from the first lead;
    a semiconductor light emitting element provided on the first lead in the concave portion between the first bent portion and the second bent portion;
    a wiring electrically connecting the semiconductor light emitting element and the second lead; and
    a first resin provided at least on the first lead, the first resin being optically transparent to light from the semiconductor light emitting element,
    wherein the first bent portion and the second bent portion are located substantially a same distance from the semiconductor light emitting element, and
    wherein a part of the first lead, which is provided outside of the first resin, and a part of the second lead, which is provided outside of the first resin, are symmetric with a vertical line passing through the semiconductor light emitting element in a cross-sectional view cut along a plane, the plane passing the semiconductor light emitting element and being parallel with a direction to which the first lead is extended.

11. A semiconductor light emitting device of claim 10, further comprising:
    a second resin being optically transparent to light from the semiconductor light emitting element, the second resin covering the semiconductor light emitting element and located below the first resin.

12. A semiconductor light emitting device of claim 11, wherein a filler which has a lower coefficient of thermal expansion ratio than the second resin is provided in the second resin.

13. A semiconductor light emitting device of claim 10, wherein the bent portions are substantially symmetric with a vertical line passing through the semiconductor light emitting element in a cross-sectional view cut along a plane, the plane passing the semiconductor light emitting element and being parallel with a direction to which the first lead is extended.

14. A semiconductor light emitting device of claim 10, wherein the bent portions are substantially same shape.

15. A semiconductor light emitting device of claim 10:
    wherein the first lead has a plurality of openings and the second lead has an opening,
    wherein the openings are apart a substantially same distance from the semiconductor light emitting element and have a substantially same width in a cross-sectional view cut along a plane, the plane passing the semiconductor light emitting element and being parallel with a direction which the first lead is extended to, and
    wherein the opening of the second lead and one of the openings of the first lead are apart a substantially same distance from the semiconductor light emitting element and have a substantially same width in a cross-sectional view cut along the plane.

16. A semiconductor light emitting device of claim 10, further comprising:

a second resin being optically transparent to light from the semiconductor light emitting element, the second resin provided on the first resin, the first lead and the second lead.

17. A semiconductor light emitting device of claim 16, wherein a filler, which has a lower coefficient of thermal expansion ratio than the second resin, is provided in the second resin.

18. A semiconductor light emitting device, comprising:
a first lead including a concave portion between a first bent portion and a second bent portion, the first bent portion and second bent portion being angled downward away from each other;
a second lead provided being apart from the first lead;
a semiconductor light emitting element provided on the first lead in the concave portion between the first bent portion and the second bent portion;
a wiring electrically connecting the semiconductor light emitting element and the second lead; and
a first resin provided at least on the first lead, the first resin being optically transparent to light from the semiconductor light emitting element,
wherein the first bent portion and the second bent portion are located substantially a same distance from the semiconductor light element,
wherein the first lead has an opening, and
wherein a gap from the first lead to the second lead along the direction to which the first lead is extended is substantially equal to the width of the opening of the first lead in a cross-sectional view cut along a plane, the plane passing the semiconductor light emitting element and being parallel with a direction to which the first lead is extended.

19. A semiconductor light emitting device of claim 18, further comprising:
a second resin being optically transparent to light from the semiconductor light emitting element, the second resin covering the semiconductor light emitting element and located below the first resin.

20. A semiconductor light emitting device of claim 19, wherein a filler which has a lower coefficient of thermal expansion ratio than the second resin is provided in the second resin.

21. A semiconductor light emitting device of claim 18, wherein the bent portions are substantially symmetric with a vertical line passing through the semiconductor light emitting element in a cross-sectional view cut along a plane, the plane passing the semiconductor light emitting element and being parallel with a direction to which the first lead is extended.

22. A semiconductor light emitting device of claim 18, wherein the bent portions are substantially same shape.

* * * * *